United States Patent
Papandreou et al.

(10) Patent No.: US 11,152,059 B2
(45) Date of Patent: *Oct. 19, 2021

(54) CALIBRATION OF OPEN BLOCKS IN NAND FLASH MEMORY

(71) Applicant: International Business Machines Corporation, Armonk, NY (US)

(72) Inventors: Nikolaos Papandreou, Thalwil (CH); Roman A. Pletka, Uster (CH); Sasa Tomic, Kilchberg (CH); Nikolas Ioannou, Zurich (CH); Charalampos Pozidis, Thalwil (CH); Aaron D. Fry, Richmond, TX (US); Timothy Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 76 days.

This patent is subject to a terminal disclaimer.

(21) Appl. No.: 16/681,899

(22) Filed: Nov. 13, 2019

(65) Prior Publication Data

US 2020/0082878 A1  Mar. 12, 2020

Related U.S. Application Data

(63) Continuation of application No. 16/102,086, filed on Aug. 13, 2018, now Pat. No. 10,614,881.

(51) Int. Cl.
*G11C 29/12* (2006.01)
*G11C 11/56* (2006.01)
(Continued)

(52) U.S. Cl.
CPC ........ *G11C 11/5642* (2013.01); *G06F 3/0604* (2013.01); *G06F 3/0632* (2013.01);
(Continued)

(58) Field of Classification Search
None
See application file for complete search history.

(56) References Cited

U.S. PATENT DOCUMENTS 9,530,517 B2  12/2016  Lee et al.
9,563,373 B2  2/2017  Camp et al.
(Continued)

OTHER PUBLICATIONS

Bjorling, M., et al., "LightNVM: The Linux Open-Channel SSD Subsystem", 15th USENIX Conference on File and Storage Technologies (FAST '17), https://www.usenix.org/system/files/conference/fast17/fast17-bjorling.pdf, Feb. 27-Mar. 2, 2017, pp. 359-373.
(Continued)

*Primary Examiner* — Ryan Bertram
*Assistant Examiner* — Trang K Ta
(74) *Attorney, Agent, or Firm* — Scully, Scott, Murphy & Presser, P.C.; Daniel P. Morris

(57) ABSTRACT

Performing a calibration of a NAND flash memory block that is in an open state. An open state of the NAND flash memory block is detected, the NAND flash memory block comprising a plurality of memory pages, each of which comprising a plurality of memory cells. A group of pages of the NAND flash memory block being in an open state having comparable characteristics is identified. A calibration of read voltage values to pages of the group of identified pages is performed.

20 Claims, 8 Drawing Sheets

(51) Int. Cl.
*G06F 3/06* (2006.01)
*G11C 16/04* (2006.01)
*G11C 16/26* (2006.01)

(52) U.S. Cl.
CPC .......... *G06F 3/0659* (2013.01); *G06F 3/0679* (2013.01); *G11C 11/5671* (2013.01); *G11C 16/0483* (2013.01); *G11C 16/26* (2013.01)

(56) References Cited

U.S. PATENT DOCUMENTS

| | | | |
|---|---|---|---|
| 9,761,308 B1 | 9/2017 | Cometti | |
| 9,772,936 B2 | 9/2017 | Klein | |
| 2014/0365836 A1* | 12/2014 | Jeon | G11C 29/021 714/721 |
| 2015/0205664 A1* | 7/2015 | Janik | G06F 11/1012 714/764 |
| 2016/0141044 A1* | 5/2016 | Sun | G11C 16/3418 365/185.11 |
| 2017/0263311 A1 | 9/2017 | Cometti | |
| 2017/0371744 A1 | 12/2017 | Sehgal et al. | |
| 2018/0033491 A1 | 2/2018 | Marelli et al. | |

OTHER PUBLICATIONS

Jedrak, M., "How to Achieve the Highest Data Rate in NAND Flash Application", EVATRONIX, https://www.google.co.in/url?sa=t&rct=j&q=&esrc=s&source=web&cd=1&cad=rja&uact=8&ved=0ahUKEwjh04mFla_YAhUeS48KHb9FBwwQFggmMAA&url=http%3A%2F%2Fwww.edn.com%2FPdf%2FViewPdf%3FcontentItemId%3D4236755&usg=AOvVaw1tkNiU1J2K0GjrGbOw4WWx, Accessed on Aug. 13, 2018, 8 pages.

List of IBM Patents or Patent Applications Treated as Related, dated Nov. 13, 2019, 2 pages.

* cited by examiner

100

102  detecting an open state of a NAND flash memory block 104  identifying a group of memory pages 106  performing a calibration of read voltage values

CALIBRATION OF OPEN BLOCKS IN NAND FLASH MEMORY

FIELD

The present disclosure relates generally to a method for performing a calibration of a NAND flash memory, and more specifically, to computer-implemented method for performing a calibration of a NAND flash memory block that is in an open state. The present disclosure relates further to a memory controller for performing a calibration of a NAND flash memory block that is in an open state, and a computer program product.

BACKGROUND

Enterprise storage capacity requirements are growing consistently. At the same time, prices for flash storage units—e.g., SSDs (solid-state drive)—have decreased significantly in comparison to hard disk drive storage systems so that the industry demand for NAND flash-based memory has increased significantly. The cell density of such NAND flash memories is also ever-increasing and the number of bits storable per cell is also increasing—e.g., TLC (triple level cell) or QLC (quad level cell), etc.

Due to cycling, retention, read disturb, program disturb or other mechanisms that may be specific to the NAND flash cell technology (e.g., of type floating gate, as well as, charge trap), process technology (e.g., 2D or 3D), scaling node or other than the specific design factors, the programmed nominal threshold voltage ($V_{TH}$) distributions to read out data from the memory cells may change permanently (e.g. due to program/erase cycling) or temporary (e.g. due to retention effects until the block is erased and programmed again) in a slow or fast manner.

Calibration of read voltage values refers to algorithms able to track the $V_{TH}$ changes and calculate an appropriate voltage offset to adjust the read voltages applied during the application of a read with an attempt to minimize the number of bit errors. FIG. 4 shows an example of a negative shift of the $V_{TH}$ distributions due to charge-loss over time.

Modern NAND flash memory systems write many blocks (each block comprises a plurality of memory pages) in parallel to achieve high write bandwidth. At the same time, modern high-capacity NAND flash devices have blocks with many pages, e.g., 1536 pages per block. As a result, it may happen that the programmed pages in the block may be read by the host via the memory controller before all pages in the block have been programmed. Thus, a mixture of programmed and un-programmed pages may exist within a block for a given time, which in general depends on the workload running in the host or the internal relocation activities, until the block is fully programmed. When not all the pages in a block have been programmed, the block is usually referred to as an open block or a partially programmed block. When all the pages in a block have been programmed, the block is usually referred to as a complete block or a fully programmed block.

Traditionally, calibration, either nominal (e.g., during regular intervals) or on-demand (e.g., due to an error increase above a predefined threshold value), of read voltages is applied to fully programmed blocks. However, in modern 3D NAND flash devices, the block size is large (e.g., 1532 pages or more), which means that, depending on the workload, the probability of a block to remain in an open state for longer time increases. Moreover, in modern 3D NAND flash devices the $V_{TH}$ changes due to retention or read disturb effects are rapid, which means that a block in an open state may need to be calibrated before it is fully programmed.

SUMMARY

According to one aspect of the present invention, a computer-implemented method for performing a calibration of a NAND flash memory block that is in an open state may be provided. The method may comprise detecting an open state of the NAND flash memory block. The NAND flash memory block may comprise a plurality of memory pages, each of which comprising a plurality of memory cells. The method may additionally comprise identifying a group of pages of the NAND flash memory block being in an open state having comparable characteristics, and performing a calibration of read voltage values to pages of the group of identified pages.

According to another aspect of the present invention, a memory controller for performing a calibration of a NAND flash memory block that is in an open state may be provided. The memory controller may comprise a detection unit adapted for detecting an open state of the NAND flash memory block. The NAND flash memory block may comprise a plurality of memory pages, each of which comprising a plurality of memory cells. The memory controller may further comprise an identification unit adapted for identifying a group of pages of the NAND flash memory block being in an open state having comparable characteristics, and a calibration unit adapted for performing a calibration of read voltage values to pages of the group of identified pages.

Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
Figure 1:
Figure 1:

Embodiments of the invention will be described, by way of example only, and with reference to the following drawings:

FIG. 1 shows a block diagram of an embodiment of the inventive computer-implemented method for performing a calibration of a NAND flash memory block that is in an open state.

Figure 2:
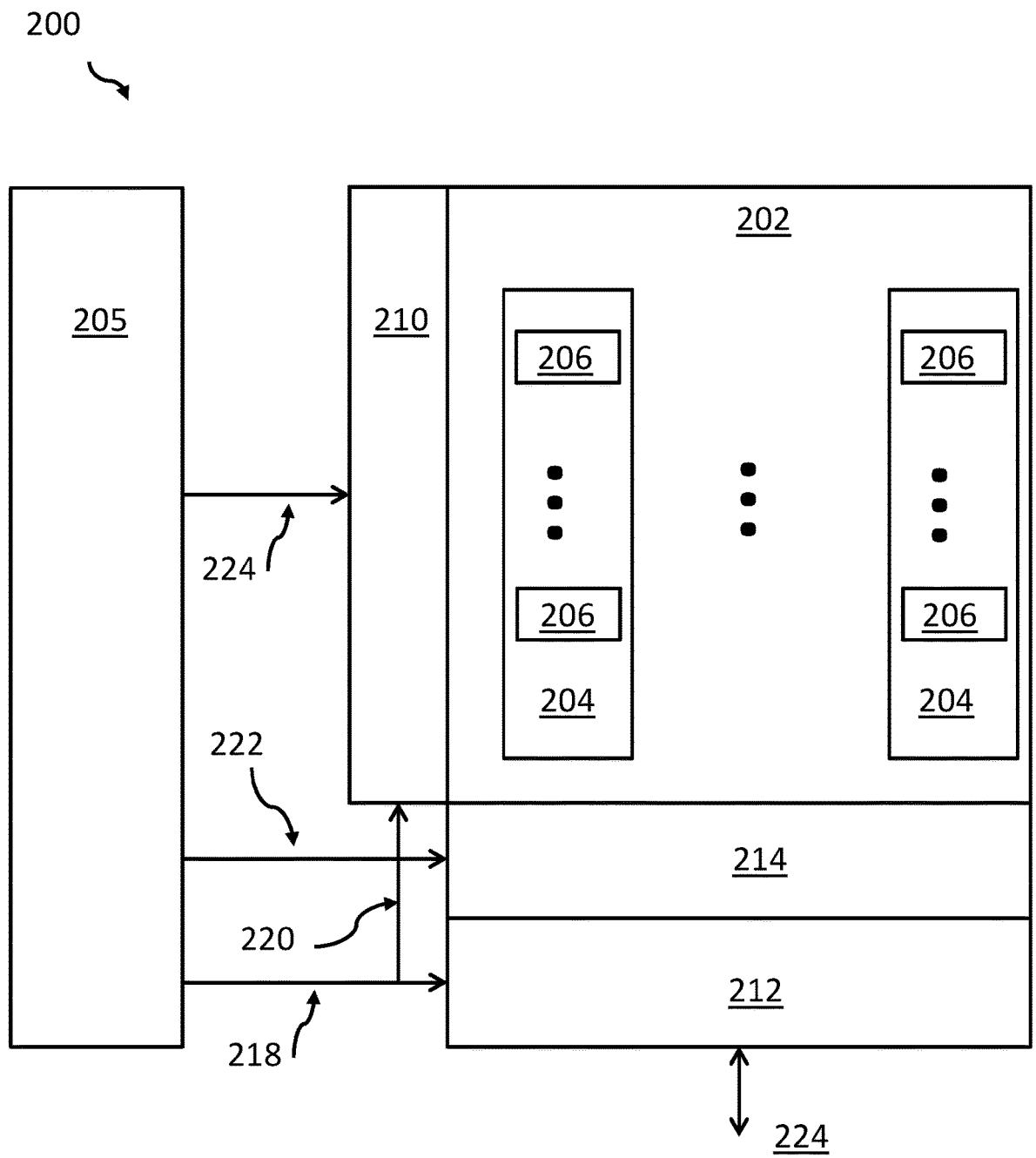

FIG. 2 shows a block diagram of an exemplary flash memory module that can be utilized to implement the proposed concept.

Figure 3:
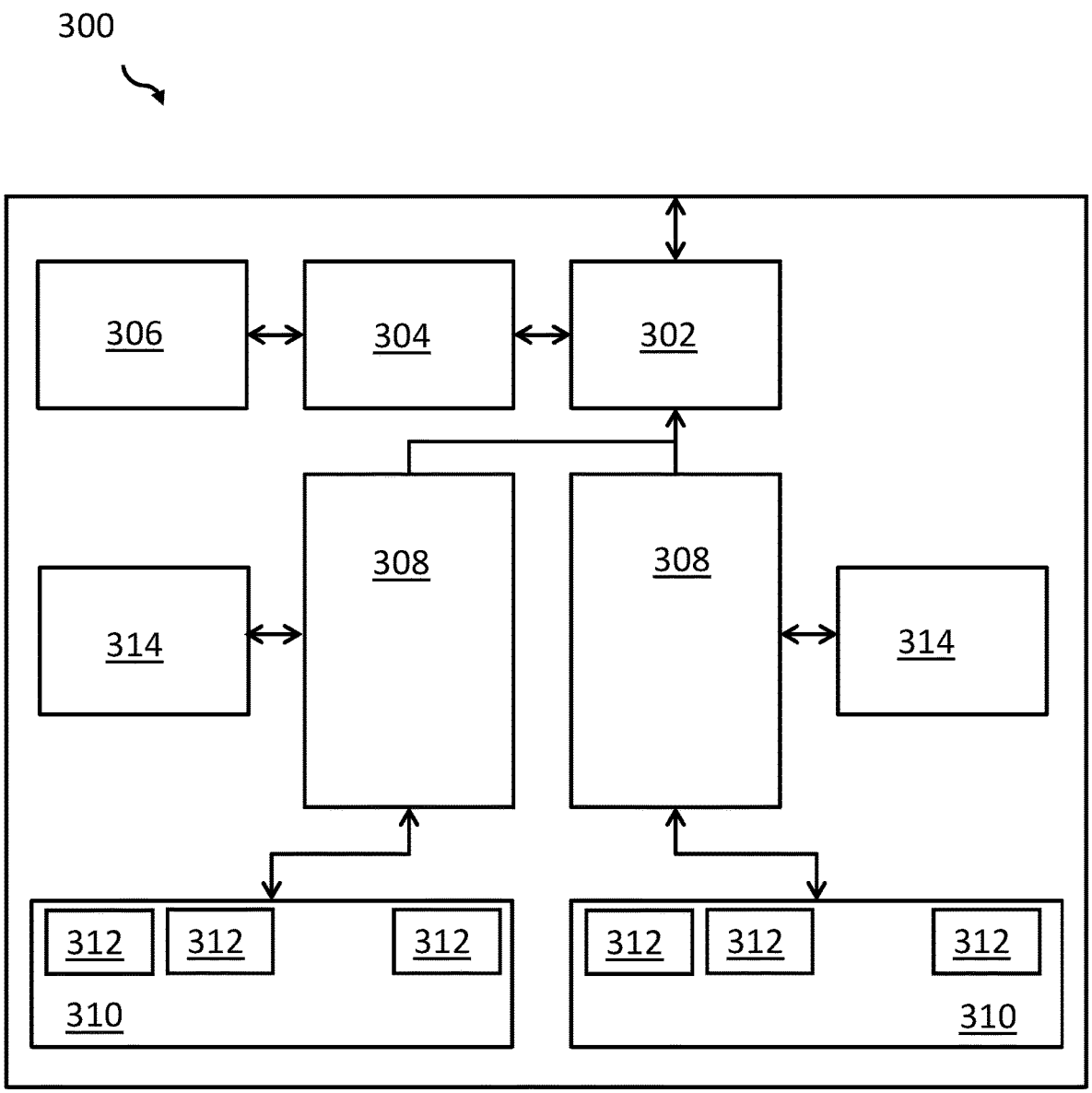

FIG. 3 shows a block diagram of a flash card used in a data storage system.

Figure 4:
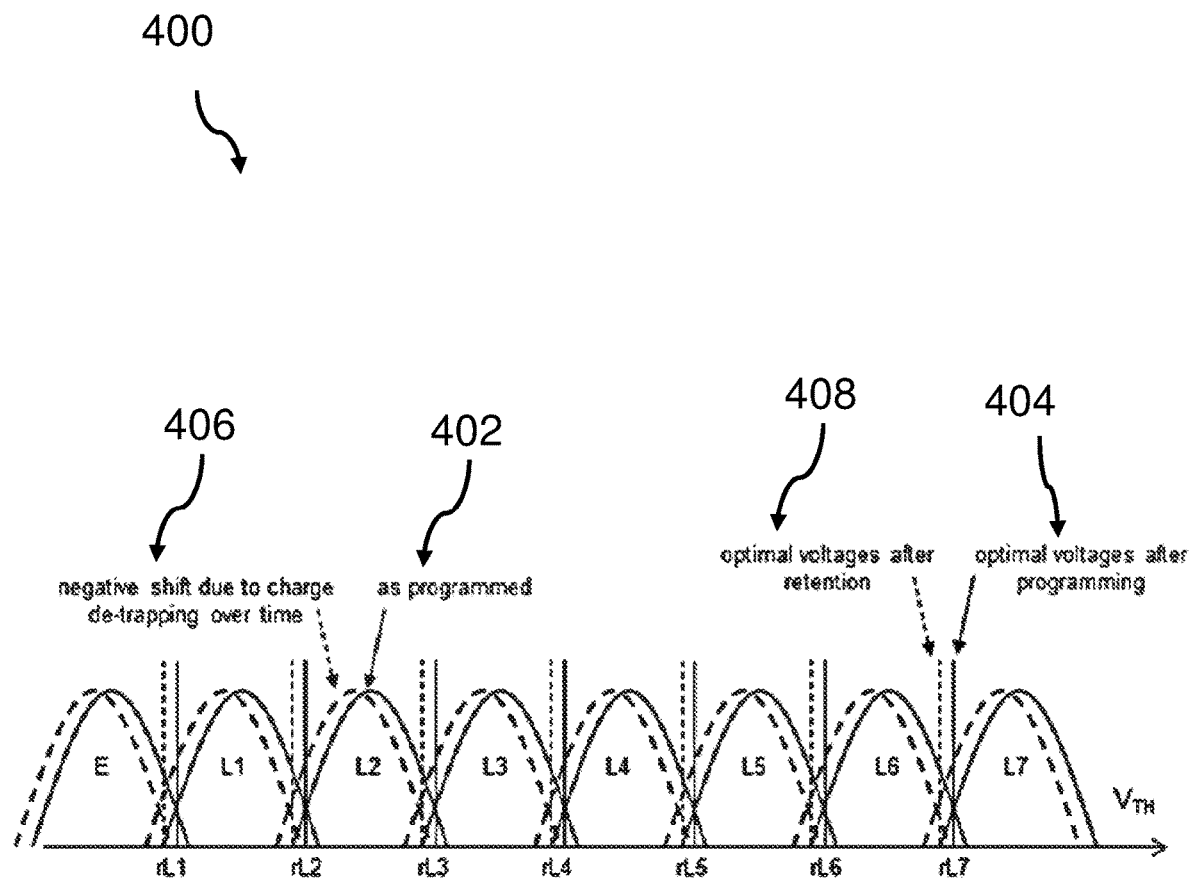

FIG. 4 shows a diagram of $V_{TH}$ distribution shifts to the left due to the relative charge loss over time.

Figure 5:
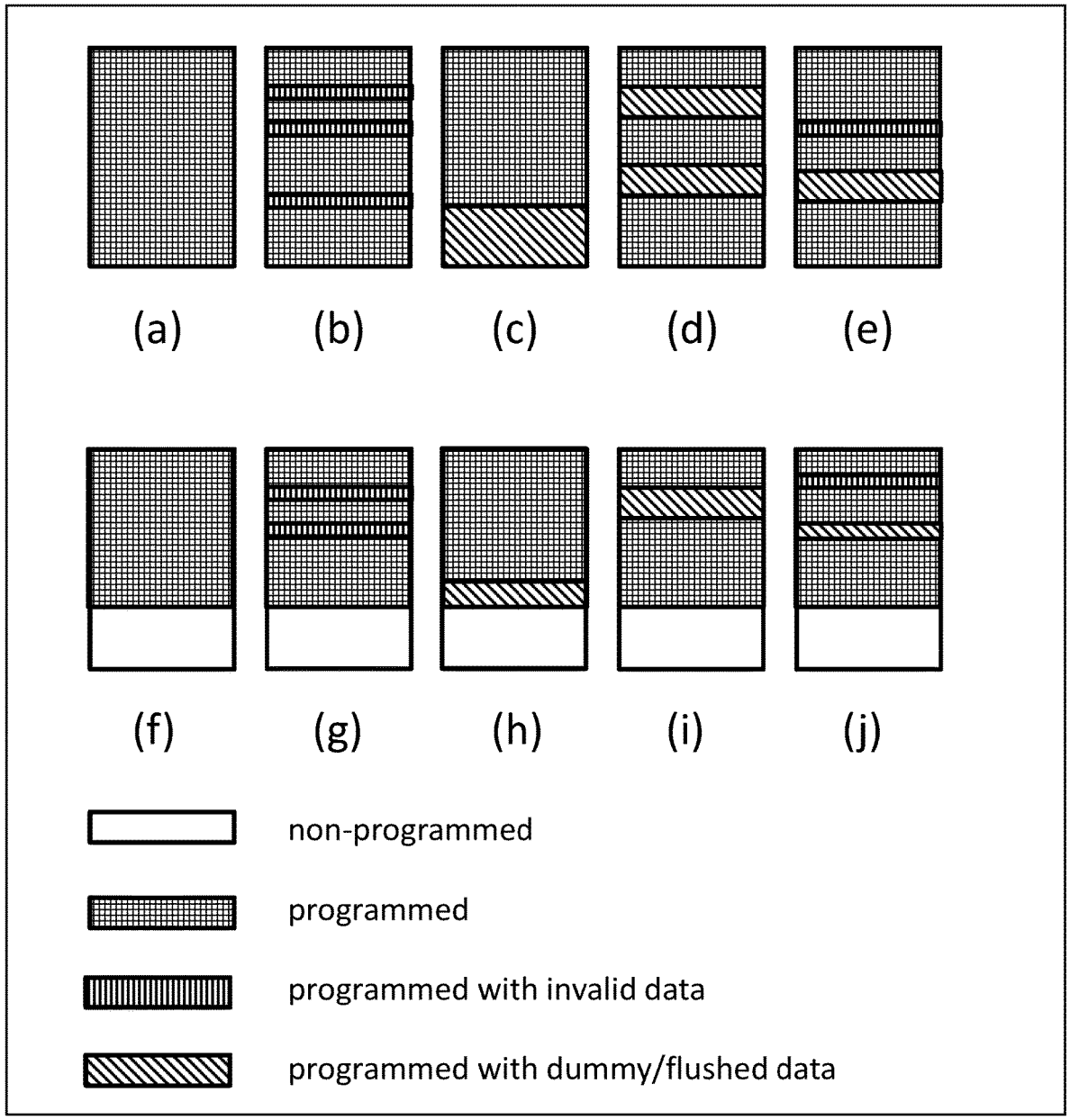

FIG. 5 shows cases of fully programmed and partially programmed NAND flash memory blocks.

Figure 6:
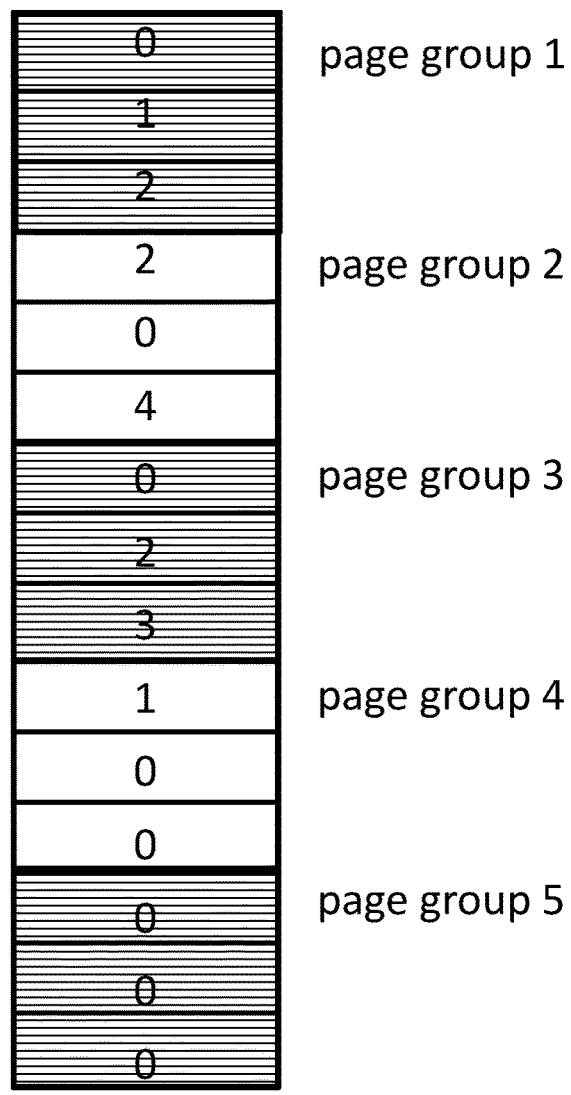

FIG. 6 shows a block diagram of an embodiment of a physical storage table with information about the number of valid logical pages in page groups of physical pages of a block.

Figure 7:
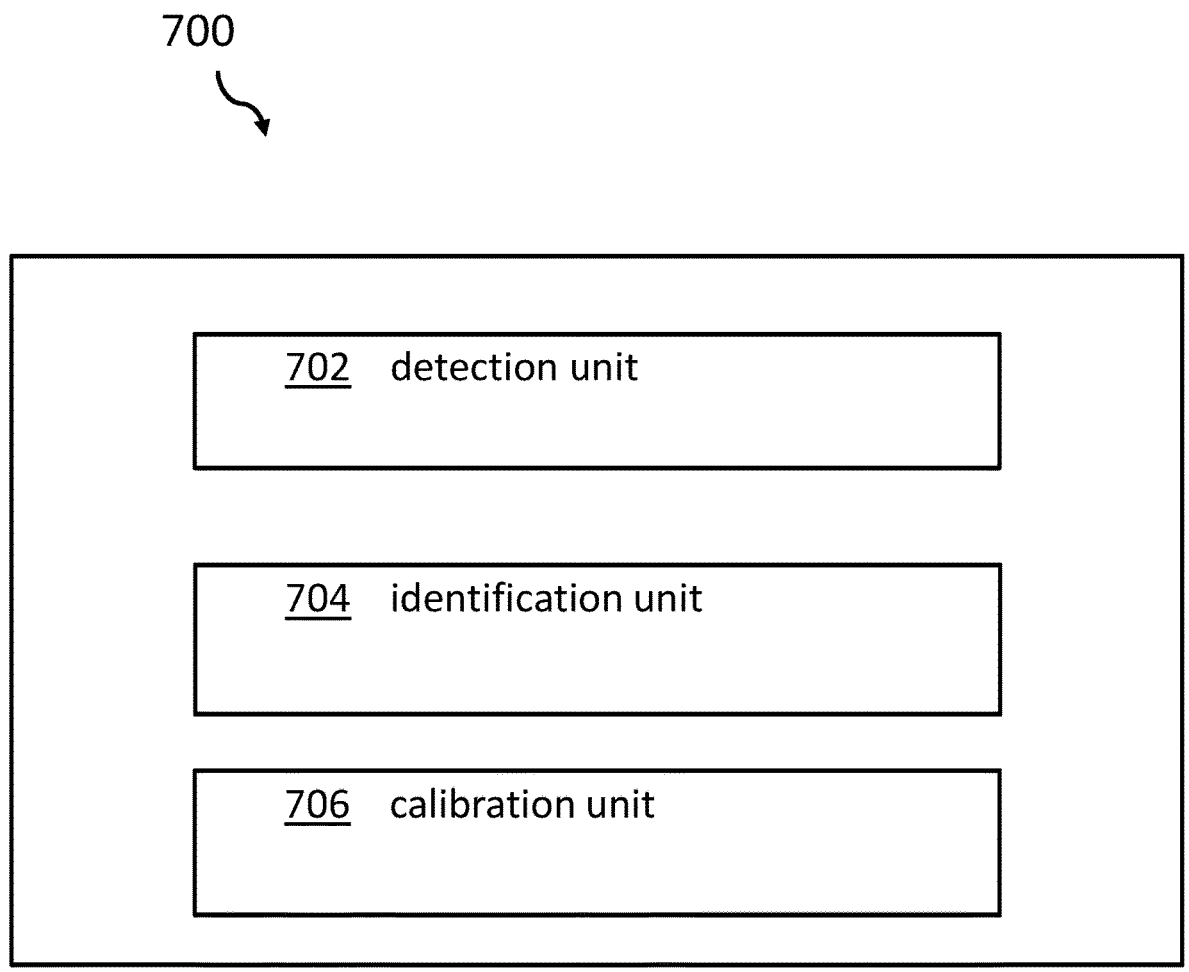

FIG. 7 shows a block diagram of a memory controller for performing a calibration of a NAND flash memory block that is in an open state.

Figure 8:
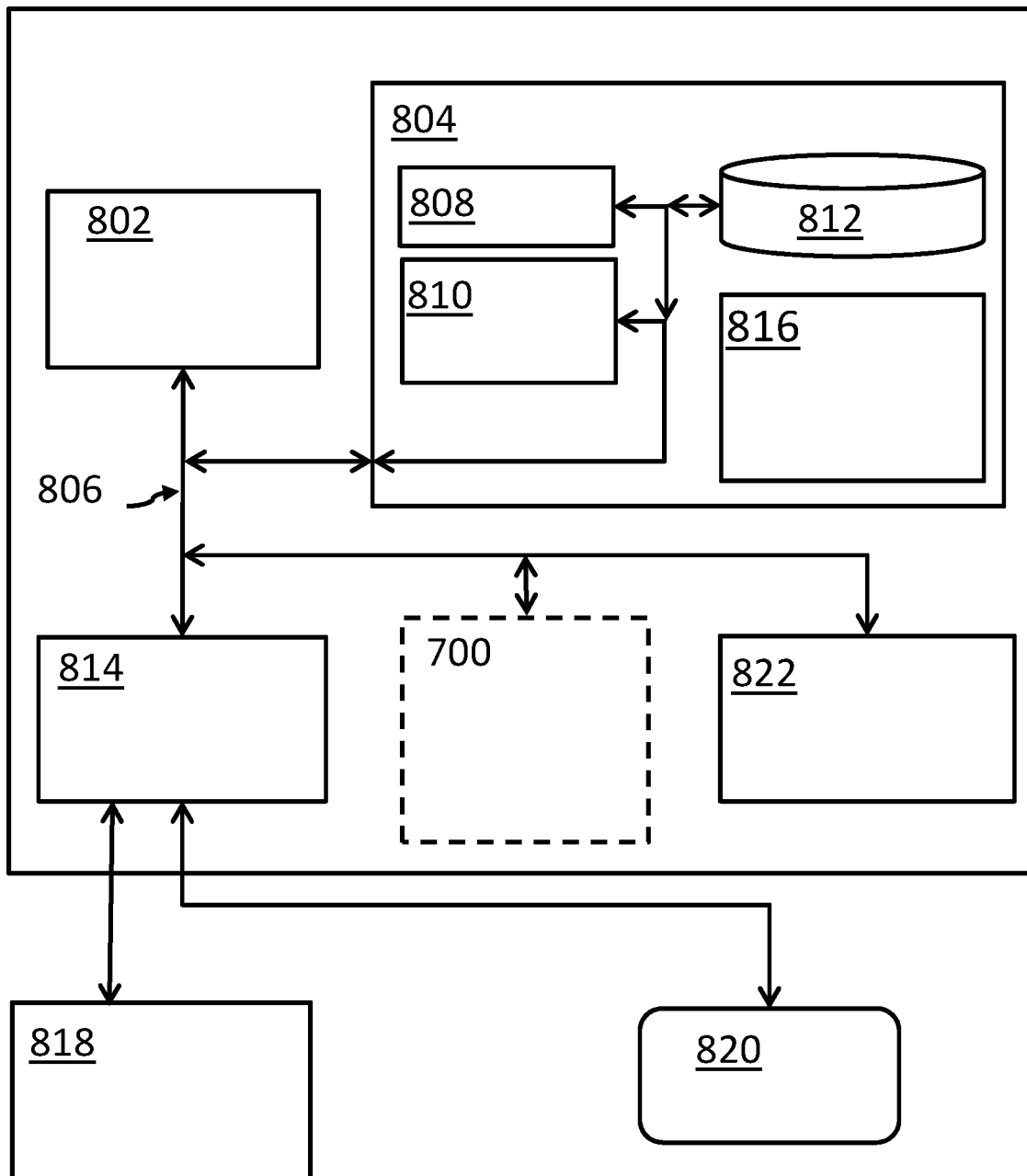

FIG. 8 shows an embodiment of a computing system comprising the proposed memory controller.

DETAILED DESCRIPTION

In the context of this description, the following conventions, terms and/or expressions may be used:

The term 'NAND flash memory' may denote an electrically programmable and erasable non-volatile memory technology that stores one or more bits of data per memory cell as a charge on the floating gate of a transistor or a similar charge trap structure. The amount of charge on the floating gate modulates the threshold voltage, $V_{TH}$, of the transistor. By applying a proper read voltage and measuring the amount of current, the programmed threshold voltage of the memory cell may be determined and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories.

In a typical implementation, a NAND flash memory array is organized in physical blocks of physical memory, each of which includes multiple physical pages each in turn containing a multiplicity of memory cells connected via a word line. By virtue of the arrangement of the word and bit lines utilized to access memory cells, flash memory arrays have generally been programmed on a physical page basis, but erased on a physical block basis. Blocks must be erased prior to being programmed. A word line may include multiple physical pages. For instance, a QLC NAND flash device has four types of physical pages: a lower, an upper, an extra, and a top page sharing the same word line.

Because the number of blocks per die and the number of physical pages per block tend to increase with each new generation of non-volatile memory, it can be impractical or even prohibitive for a controller of numerous multi-die packages to maintain unique operating parameters for each physical page under its management. Therefore, a controller may maintain certain metadata (e.g., read voltages and/or other operating parameters) for groups of physical pages having similar characteristics (e.g., bit error characteristics) rather than for individual physical pages to reduce the amount of metadata that must be stored.

NAND flash memory may be inherently susceptible to bit errors, including errors caused by program disturb effects, over-programming effects, read disturb effects, data retention (i.e., errors attributable to decay of the gate charge of programmed cells over time), and wear (i.e., errors attributable to damage to the gate dielectric due to the number of cell program/erase (P/E) cycles to which the cell is subjected). In general, the bit error rate (BER) observed for a physical page of memory that is attributable to wear is permanent and increases monotonically over the life of a NAND flash memory. Similarly, program disturb and over-programming effects can be viewed as permanent; even though they disappear after an erase operation, these two types of effects influence the BER already directly after the pages are programmed. Errors, such as those caused by read disturbs and data retention, are more transient and, although generally increasing over time, disappear by erasure of the blocks containing the affected physical pages. After a physical page is programmed, these transient effects begin to reappear gradually with increasing time and an increasing number of reads.

Data storage systems employing flash memory as a storage media generally implement flash management functions to mitigate these inherent error characteristics of flash memory. Existing systems commonly integrate at least some of these flash management functions into the data path (e.g., error correcting code (ECC) encoding and RAID-like data protection schemes), while other flash management functions operate in the background independently of any external (i.e., host) requests for the data stored in the flash memory. Examples of background flash management functions common in enterprise-class flash arrays include read sweeping, which entails reading individual physical pages to detect and correct bit errors, wear leveling, which seeks to equalize the P/E cycle counts for all physical pages, and calibration, which conventionally determines appropriate read voltages on a block-by-block basis.

The term 'read voltage shift value' may denote here an offset voltage value by which the logical bit status—e.g., "0" and "1" may be read out of a NAND flash memory cell. Read voltage shifting is used in block calibration to determine the optimal read voltage shift values. It may represent an effective method to reduce the number of read errors in the memory cells and, thus, to prolong endurance and retention for enterprise-level storage systems using NAND flash memories. The process of block calibration is normally performed as part of an automated background health check process, so as not to adversely impact user read or write operations. The background health check process may not be part of the normal operation—e.g., read and/or write of active data bits to memory cells—but may be performed outside the active usage of the memory cells during maintenance phases or during normal operation for the memory system.

The term 'state of a block', in particular 'a state of a block' of a NAND flash memory block may denote its status in respect to the number of its programmed pages, e.g., whether it is fully or partially programmed block. If all pages of a block have data written to it, e.g., all pages have been programmed, the block may be denoted as 'closed' or 'complete'. As programmed pages may also be counted pages defined as invalided or pages with invalid data (dummy data of any sort). As long as the block has one or more pages un-programmed, the block may be noted as 'open' or partially programmed.

The term 'block state information' of a NAND flash memory block may denote the state of a block and other information related to a block, such as the number of reads since programmed, the retention time, the time(s) at which the block had been calibrated, and/or other statistics related to the block. This additional information may be kept for as single values for the entire block or groups of physical pages in a block in the blocks state information.

The term 'state of a page group, in particular 'a state of a page group' of a group of pages within a NAND flash memory block may denote its status in respect to the number of its programmed pages, e.g., whether all or part of the pages comprising the page group within the memory block are programmed or not. If all pages of the page group have data written to it, e.g., all pages of the page group have been programmed, the page group may be denoted as 'closed' or 'complete'. As programmed pages within the page group may be also counted pages defined as invalided or pages with invalid data (dummy data of any sort). As long as the page group has one or more pages un-programmed, the page group may be noted as 'open' or partially programmed.

The term 'comparable characteristics' may denote a comparable history of memory cell in a related memory page of the NAND flash memory block. Characteristics may include un-programmed, same or similar number (within a pre-defined range) of program/erase cycles, same or similar (within a predefined range) level of retention, same or similar (within a predefined range) read disturb characteristic, same or similar (within a predefined range) RBER characteristics, same or similar read voltage values. The term 'comparable characteristics' may also apply to physical properties of the physical pages, namely being of the same or similar page type (e.g., lower, upper, extra, or top page), or belonging to the same layer in the 3D structure. Clearly, any of these characteristics may be combined to build a meaningful set of comparable characteristics by a person skilled in the art.

The term 'calibration' may denote a correction of one or more read voltage values due to changes in the nominal $V_{TH}$ distributions. These changes may be permanent such as changes due to wear of the memory cells as a result of repetitive program/erase cycles or temporary, such as changes due to charge loss over time or read disturb due to page reads in the same block. The correction of the read voltage values may consist of two components. A base component that may reflect the permanent changes of the $V_{TH}$ distributions and a delta component that may reflect the temporary changes of the $V_{TH}$ distributions.

The term 'base calibration' may denote a calibration of read threshold values in respect to permanent changes of the programmed $V_{TH}$ distributions, such as changes due to wear of the memory cells as a result of repetitive program/erase cycles. In a base calibration, a corrective offset is calculated to be applied to one or more read voltages with an attempt to minimize the number of bit errors. The corrective offset of the base calibration is kept when the block is erased.

The term 'delta calibration' may denote a calibration of read threshold values in respect to temporary changes of the programmed $V_{TH}$ distributions, such as changes due to charge loss over time or read disturb due to page reads in the same block. In a delta calibration, a corrective offset is calculated to be an applied to one or more read voltages with an attempt to minimize the number of bit errors. The corrective offset of the delta calibration is removed when the block is erased. Upon a read operation, both components, the corrective offsets from base and delta calibrations are applied.

It may also be advantageous that the base calibration may be performed on completed memory blocks soon after a memory block is programmed and before any temporary or transient effects start to affect the $V_{TH}$ distributions.

However, in a block that stayed a long time in the open state, in other words there is a significant difference between the points in time when the first and last physical pages are programmed, physical pages being programmed significantly earlier than others may have experienced a non-eligible amount of retention or read disturbs. Therefore, those pages (or page groups) may no longer be base calibrated and should rather be delta calibrated instead. The base calibration of those affected pages or page groups may hence be deferred.

The term 'invalided memory pages' may denote memory pages that no longer hold valid user data, e.g., the user data has been relocated to other memory blocks.

The proposed computer-implemented method for performing a calibration of a NAND flash memory block that is in an open state may offer multiple advantages and technical effects:

As the capacity of NAND flash memory increases with each new generation, it is usually observed that the size of the NAND memory block in terms of the number of pages also increases. As an example, in current 3D NAND technology, the size of the block may be 1536 pages or higher. As a result, the time the block may stay in an open state before all the pages are filled with data also increases. Moreover, in the 3D NAND technology, the changes in the programmed $V_{TH}$ distributions due to retention or read disturb effects are more rapid and require more robust and accurate tracking. In addition, when the number of stored bits per cell is high, e.g., in TLC or in QLC NAND flash, the changes in the programmed $V_{TH}$ distributions result in a rapid increase of the BER, thus an effective means to calibrate the read voltages is necessary. It is therefore advantageous to implement a method to detect and calibrate NAND flash blocks that are in an open state. It is also beneficial to determine the time a block is in open state and decide to close the block with random data if a predetermined time period is elapsed.

It may also be noted that the here proposed concept is not limited to 3D NAND flash memory modules. The method may also be applied to 2D (planar) NAND flash memory. The concept may also be applied to blocks using single level cells (SLC), as well as, multi-level cells (MLC), triple level cells (TLC), and/or quad-level cells (QLC). Also higher level NAND flash memory cells are not excluded.

It may also be mentioned that due to the small margin of $V_{TH}$ levels in TLC and higher order NAND flash, such as QLC, any wear mechanism that affects the $V_{TH}$ distribution may result in a significant impact on the error characteristic and on the optimal read voltage tracking. Also the effect that memory pages in a page group cannot stay open for a long time because otherwise the $V_{TH}$ characteristics of pages within the group may differ significantly: e.g., pages programmed earlier vs. later, or, read disturb effects on programmed pages vs. un-programmed pages.

As parts of a block may already be calibrated while the block is in the open state, the likelihood to perform a base calibration instead of a delta calibration for the page groups being calibrated in the open block increases. This helps to eliminate peaks in the RBER where after a block erase and reprogramming of the block the delta values are reset and hence more accurate read threshold values from the base calibration are available.

In the following, additional embodiments of the proposed method—also applicable to the related memory controller—will be discussed:

According to one embodiment of the method, the calibration may be a delta calibration reflecting temporary changes in the $V_{TH}$ only. Temporary changes in the $V_{TH}$ may be viewed in contrast to permanent changes in the $V_{TH}$, e.g., due to program/erase cycles that wear the memory cells of a memory page. Temporary changes may relate to transient or time limited changes in the $V_{TH}$, e.g., due to read disturb when reading pages in the block or due to charge loss during time.

According to one embodiment of the method, wherein calibrating pages of the identified group of page may be done using a delta calibration based on the block state information indicating the page group being affected by temporary changes in the $V_{TH}$, and wherein calibrating pages of the identified page group may be done using a base calibration based on the block state information indicating that one or more page groups are not being affected by temporary changes in the $V_{TH}$. The base calibration may address permanent changes of $V_{TH}$ related to e.g., wear-out.

According to one embodiment, the method may also comprise determining a time the NAND flash block has remained in an open state. A timer or a counter (up or down counter) may be used for this, which may be reset or initialized when the programming of the NAND flash memory was started. This way it may be ensured that a memory block may not remain open to long, e.g., only 1 to 2 hours.

According to a further embodiment, the method may also comprise writing—e.g., programming or flushing—a part or all of not yet programmed pages of the NAND flash memory block being in an open state if a predetermined time period, which starts when a first page of the NAND flash memory block is written, is elapsed.

Consequently, and according to one optional embodiment of the method, the predetermined time period may correspond to the time, the NAND flash memory has remained in an open state.

According to one alternative embodiment of the method, the predetermined time period may correspond to the time, the last programmed page group has remained in an open state.

According to one permissive embodiment of the method, the writing may comprise writing a predetermined data pattern or a random data pattern to the not yet programmed pages of the NAND flash memory block. This process may also be denoted as flushing the yet un-programmed pages. Basically, this is equivalent to close either the memory block or a group of pages.

According to one allowable embodiment of the method, the NAND flash memory block in the open state may comprise, besides non-programmed memory pages, memory pages that are invalidated memory pages or flushed memory pages. Because of the invalidated memory pages may no longer hold valid user data, a calibration is not required. Therefore, for performance reasons, any calibration—e.g., base and/or data calibration—of the invalidated and/or flushed memory pages may be skipped. Information about the invalidated and/or flushed memory pages may be available from a dynamically maintained table in a memory controller.

In the following, a detailed description of the figures will be given. All instructions in the figures are schematic. Firstly, a block diagram of an embodiment of the inventive computer-implemented method for performing a calibration of a NAND flash memory block that is in an open state is given. Afterwards, further embodiments, as well as embodiments of the memory controller for performing a calibration of a NAND flash memory block that is in an open state, will be described.

FIG. 1 shows a block diagram of an embodiment of the computer-implemented method 100 for performing a calibration of a NAND flash memory block that is in an open state. The NAND flash memory may be of 2D or 3D technology. The method comprises detecting, 102, an open state of the NAND flash memory block—the memory block may either be open or closed by, e.g., using information from a related memory controller that interfaces with the NAND flash chip. The NAND flash memory block comprises a plurality of memory pages, each of which comprising a plurality of memory cells as usual.

The method 100 comprises further identifying, 104, a group of pages of the NAND flash memory block being in an open state having comparable characteristics. The pages that consist the group of memory pages may be pre-defined based on characterization or factory data or may be re-defined during device lifetime, e.g., by examining the page characteristics such as bit errors, number of reads, etc. The group of memory pages may comprise one or more memory pages. Thus, a single memory page may define a group of memory pages.

Additionally, the method comprises performing, 106, a calibration of one or more read voltage values to pages of the group of identified pages. In one embodiment, the just mentioned calibration of the read voltage value(s) may be a delta or base calibration.

It may also be noted that one or more read voltage values may be calibrated. These may comprise three read voltage values in total for MLC, seven read voltage values voltages for TLC, and 15 read voltage values for QLC NAND devices. However, also the case that only one read voltage value may require a calibration is possible.

Before discussing specific embodiments of the here proposed concept and for a general understanding in which context the here proposed concept may be implemented advantageously, reference is now made to FIG. 2, in which a block diagram of an exemplary flash memory module 200 is depicted, which may be used to implement the here proposed concept. The flash memory module 200 comprises one or more memory dies, each implementing at least one memory array 202, e.g., formed of 3-D NAND flash memory cells. As indicated in FIG. 2, the memory cells within the memory array 202 are physically arranged in multiple blocks 204, in turn comprising multiple physical pages 206.

As known to those skilled in the art, NAND flash memory, such as that employed in memory array 202, has to be erased prior to being programmed. Further, NAND flash memory can be (but is not required to be) constrained by its architecture, such that the smallest granule of storage that can be erased is a block 204 and the smallest granule of storage that can be accessed by a read or write operation is fixed to the size of a single physical page 206 (as already explained above in another context). It should be appreciated in this regard that the LBAs (logical block address) provided by a host device correspond to logical pages within a logical address space, wherein each logical page typically has a size of e.g., 4 kB (kilobytes). Physical pages 206, in contrast, typically have a larger size, e.g., 16 kB, and can thus correspond to multiple logical pages.

The flash memory module 200 further comprises a row decoder 210, through which word lines of the memory array 202 may be addressed (address line 220) and the column decoder 212, through which bit lines of the memory array 202 may be addressed (address line 218). In addition, the flash memory module 200 comprises a read/write circuit 214 that enables the memory cells of a physical page 206 to be programmed or read in parallel. The flash controller circuitry at 200 additionally comprises a control circuit 205 that provides chip-level control of operations (commands 222, 224) of the memory array 202, including read and write accesses made to physical memory pages 206, erasure of data in blocks 204, and the amplitude, duration and plurality of related voltages applied to the memory array 202. The data input/output to/from the flash memory module 200 may flow along the double arrow 224. It may be helpful to keep this general architecture in mind when referring to the following figures.

FIG. 3 shows a block diagram of a flash card 300 used in a data storage system (not shown). The here proposed concept—either as a method or as a related controller/system—may be implemented on the level of the flash card 300.

The flash card 300 includes a gateway 302 that serves as an interface between the flash card 300 and RAID controllers or host bus adapters (HBA) of the data storage system (not shown). The gateway 302 is coupled to a general-purpose processor (GPP) 304, which can be configured (e.g., by program code) to perform pre-processing on operations received by the gateway 302 and/or to schedule servicing of the operations by the flash card 300. The GPP 304 is coupled to a GPP memory 306 (random access memory/DRAM) that can conveniently buffer data created, reference and or modified by GPP 304 in the cause of its processing or data flowing through the gateway 302 destined for one or more of the flash controllers 308.

The gateway 302 is further coupled to one or more multiple flash controllers 308, each of which controls a respective NAND flash memory system 310 which comprises multiple individually addressable NAND flash memory storage devices 312. The flash controllers 308 can be implemented, for example, by an ASIC (application specific integrated circuit) and/or a FPGA (field programmable gate array), and/or a microprocessor, and each flash controller 308 can have an associated flash controller memory 314 (e.g., DRAM). In embodiments in which flash controllers 308 are implemented with an FPGA, the GPP 304 may program and configure the flash controllers 308 during start-up and data of the higher-level data storage system. After start-up, in general, and operation, the flash controllers 308 receive read and write operations from the gateway 302 that requests to read data stored in the NAND flash memory system 310 and/or to store data in the NAND flash memory system 310. The flash controllers 308 service these operations, for example, by accessing the NAND flash memory system 310 to read or write the requested data from or into the NAND flash memory system 310, or by accessing a memory cache (not illustrated) associated with the NAND flash memory system 310.

The flash controllers 308 implement a flash translation layer (FTL) that provides a logical-to-physical address translation to enable access to specific memory locations within the NAND flash memory system 310. In general, an operation received by the flash controller 308 from a host device, such as a higher-level processor system, contains the logical block address (LBA) at which the data is to be accessed (read or written) and, if a write operation, the write data to be stored to the NAND flash memory system 310. The operation may also specify the amount (or size) of the data to be accessed. Other information may also be communicated depending on the protocol and features supported by the data storage system. The flash translation layer translates LBAs received from a RAID controller into physical addresses assigned to corresponding physical locations in the NAND flash memory system 310. The flash controllers 308 may perform address translations and or store mappings between logical and physical addresses in a logical-to-physical translation data structure, such as a logical-to-physical translation table (LPT), which may conveniently be stored in the flash controller memory 314.

FIG. 4 shows an exemplary diagram 400 of the $V_{TH}$ distributions of a TLC NAND memory. In TLC NAND, each memory cell stores 3 bits of information, therefore, the $V_{TH}$ distributions correspond to 8 possible discrete levels (E, L1, . . . , L7). The solid distributions 402 indicate the $V_{TH}$ levels after programming. The vertical solid lines 404 indicate the read voltages (rL1, . . . , rL7) that are optimal for the $V_{TH}$ distributions 402. The dashed distributions 406 indicate a negative shift of the $V_{TH}$ levels due to charge loss over time. Because of this negative shift to lower voltages, the read voltages 404 are no longer optimal. Indeed, a corrective negative offset needs to be applied to the read voltages in order to account for the changes of the $V_{TH}$ distributions from 402 to 406. The vertical dashed lines 408 indicate the read voltages (rL1, . . . , rL7) that are optimal during retention for the $V_{TH}$ distributions in 406. In general, each of the 8 levels (E, L1, . . . , L7) shown in the figure may have a different $V_{TH}$ shifts and thus, each of the 7 read voltages (rL1, . . . , rL7) may have a different optimal shift.

FIG. 5 shows the case of fully programmed and partially programmed blocks of NAND flash with mixed combinations of programmed pages with valid user data, programmed pages with invalid data, flushed pages with dummy data or not programmed pages. Due to performance considerations, it may be advantageous to only apply a base or delta calibration to programmed pages and not to invalid pages, non-programmed pages or pages with dummy/flushed pages. Flushed pages may be programmed with any data, either predefined sample data or random data. This may be advantageous in order to close a block after a predetermined amount of time elapsed since the block is in open state, i.e., after the first page of a block (or page group) has been programmed, or since the last programmed page group in the block is in open state.

FIG. 6 shows a block diagram of an embodiment of a page state table (PST) 600 with information about the number of valid logical pages within a physical memory page of a NAND memory block. E.g., the first group of memory pages (page group 1) may comprise of 3 physical pages where the first physical page may comprise zero valid logical pages, the second physical page may comprise 1 logical page and the third physical page may comprise two valid logical pages. The number of logical pages within each physical page may depend on the type of compression applied before writing the data to the physical pages and the number of logical pages that have been overwritten since the logical page was stored in the physical page. In the example of FIG. 6, a zero counter in the PST indicates that there is no valid data in the physical page (maybe flushed or invalided pages or not programmed pages).

The zeros in the PST of a block can be used to determine which page groups can be calibrated in an open block. In particular, a page group with all zeros can be skipped from calibration as is the case for page group 5 in FIG. 6. In an alternative embodiment, the number of zeros at the end of the PST of a block can be used as an approximation to detect if a block is in open state or not.

FIG. 7 shows a block diagram of the memory controller 700 for performing a calibration of a NAND flash memory block that is in an open state. The memory controller 700 comprises a detection unit 702 adapted for detecting an open state of the NAND flash memory block. The NAND flash memory block comprising a plurality of memory pages, each of which comprising a plurality of memory cells.

The memory controller 700 comprises further an identification unit 704 adapted for identifying a group of pages of the NAND flash memory block being in an open state having comparable characteristics, and a calibration unit 706 adapted for performing a calibration of one or more read voltage values to pages of the group of identified pages.

Embodiments of the invention may be implemented together with virtually any type of computer, regardless of the platform being suitable for storing and/or executing program code. FIG. 8 shows, as an example, a computing system 800 suitable for executing program code related to the proposed method.

The computing system 800 is only one example of a suitable computer system, and is not intended to suggest any limitation as to the scope of use or functionality of embodiments of the invention described herein, regardless, whether the computer system 800 is capable of being implemented and/or performing any of the functionality set forth hereinabove. In the computer system 800, there are components, which are operational with numerous other general purpose or special purpose computing system environments or configurations. Examples of well-known computing systems, environments, and/or configurations that may be suitable for use with computer system/server 800 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 800 may be described in the general context of computer system-executable instructions, such as program modules, being executed by a computer system 800. Generally, program modules may include routines, programs, objects, components, logic, data structures, and so on that perform particular tasks or implement particular abstract data types. Computer system/server 800 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 800 is shown in the form of a general-purpose computing device. The components of computer system/server 800 may include, but are not limited to, one or more processors or processing units 802, a system memory 804, and a bus 806 that couple various system components including system memory 804 to the processor 802. Bus 806 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 800 typically includes a variety of computer system readable media. Such media may be any available media that is accessible by computer system/server 800, and it includes both, volatile and non-volatile media, removable and non-removable media.

The system memory 804 may include computer system readable media in the form of volatile memory, such as random access memory (RAM) 808 and/or cache memory 810. Computer system/server 800 may further include other removable/non-removable, volatile/non-volatile computer system storage media. By way of example only, a storage system 812 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 806 by one or more data media interfaces. As will be further depicted and described below, memory 804 may include at least one program product having a set (e.g., at least one) of program modules that are configured to carry out the functions of embodiments of the invention.

The program/utility, having a set (at least one) of program modules 816, may be stored in memory 804 by way of example, and not limiting, as well as an operating system, one or more application programs, other program modules, and program data. Each of the operating systems, one or more application programs, other program modules, and program data or some combination thereof, may include an implementation of a networking environment. Program modules 816 generally carry out the functions and/or methodologies of embodiments of the invention, as described herein.

The computer system/server 800 may also communicate with one or more external devices 818 such as a keyboard, a pointing device, a display 820, etc.; one or more devices that enable a user to interact with computer system/server 800; and/or any devices (e.g., network card, modem, etc.) that enable computer system/server 800 to communicate with one or more other computing devices. Such communication can occur via Input/Output (I/O) interfaces 814. Still yet, computer system/server 800 may communicate with one or more networks such as a local area network (LAN), a general wide area network (WAN), and/or a public network (e.g., the Internet) via network adapter 822. As depicted, network adapter 822 may communicate with the other components of computer system/server 800 via bus 806. It should be understood that, although not shown, other hardware and/or software components could be used in conjunction with computer system/server 800. Examples, include, but are not limited to: microcode, device drivers, redundant processing units, external disk drive arrays, RAID systems, tape drives, and data archival storage systems, etc.

Additionally, the system 700 for performing a calibration of a NAND flash memory block that is in an open state or the controller 300 according to FIG. 3 may be attached to the bus system 806, or I/O interfaces 814, or may be implemented in an external device 818 such as an external storage system.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A computer-implemented method of performing a calibration of a NAND flash memory block, said method comprising:
    detecting an open state of said NAND flash memory block, said NAND flash memory block comprising a plurality of memory pages, each of which comprising a plurality of memory cells;
    identifying a group of memory pages of said NAND flash memory block being in an open state having comparable characteristics; and
    performing a calibration of read voltage values to pages of said group of identified pages,
    wherein said NAND flash memory block in said open state comprises, besides non-programmed memory pages, memory pages that are invalidated pages, and wherein any invalidated pages of said NAND flash memory block are excluded from said calibration.

2. The method according to claim 1, wherein said calibration is a delta calibration reflecting temporary changes in said programmed threshold voltage distributions only.

3. The method according to claim 1, wherein calibrating pages of said identified group of page is done using a delta calibration based on said block state information indicating said page group being affected by temporary changes in said programmed threshold voltage distributions, and wherein calibrating pages of said identified page group is done using a base calibration based on said block state information indicating said page group not being affected by temporary changes in said programmed threshold voltage distributions.

4. The method according to claim 1, further comprising determining a time said NAND flash block has remained in an open state.

5. The method according to claim 4, further comprising writing a part or all of not yet programmed pages of said NAND flash memory block being in an open state if a predetermined time period is elapsed.

6. The method according to claim 5, wherein said predetermined time period corresponds to said time, said NAND flash memory has remained in an open state.

7. The method according to claim 5, wherein said predetermined time period corresponds to said time, a programmed page group has remained in an open state.

8. The method according to claim 5, wherein said writing comprises writing a predetermined data pattern or a random data pattern to said not yet programmed pages of said NAND flash memory block.

9. The method according to claim 1, wherein the identifying a group of memory pages of said NAND flash memory block being in an open state having comparable characteristics includes identifying a group of memory pages of said NAND flash memory block being in an open state having comparable history.

10. The method according to claim 1, wherein the characteristics include program and erase cycles.

11. The method according to claim 1, wherein the characteristics include a level of retention.

12. A memory controller for performing a calibration of a NAND flash memory block that is in an open state, said memory controller comprising:
    a detection unit adapted for detecting an open state of said NAND flash memory block, said NAND flash memory block comprising a plurality of memory pages, each of which comprising a plurality of memory cells;
    an identification unit adapted for identifying a group of pages of said NAND flash memory block being in an open state having comparable characteristics; and
    a calibration unit adapted for performing a calibration of read voltage values to pages of said group of identified pages,
    wherein said NAND flash memory block in said open state comprises non-programmed memory pages and memory pages that are invalidated memory pages, wherein any invalidated pages of said NAND flash memory block are excluded from said calibration.

13. The memory controller according to claim 12, wherein said calibration is a delta calibration reflecting temporary changes in said programmed threshold voltage distributions only.

14. The memory controller according to claim 12, where calibrating pages of said identified group of page is done using a delta calibration based on said block state information indicating said page group being affected by temporary changes in said programmed threshold voltage distributions, and wherein calibrating pages of said identified page group is done using a base calibration based on said block state information indicating said page group not being affected by temporary changes in said programmed threshold voltage distributions.

15. The memory controller according to claim 12, further comprising a time determination unit adapted for determining a time said NAND flash block has remained in an open state.

16. The memory controller according to claim 12, further comprising a programming unit adapted for writing a part or all of not yet programmed pages of said NAND flash memory block being in an open state if a predetermined time period is elapsed.

17. The memory controller according to claim 16, further comprising at least one of:

wherein said predetermined time period corresponds to said time, said NAND flash memory has remained in an open state;

wherein said predetermined time period corresponds to said time a programmed page group has remained in an open state; and wherein said programming unit is further adapted for writing a predetermined data pattern or a random data pattern to said not yet programmed pages of said NAND flash memory block.

18. A computer program product for performing a calibration of a NAND flash memory block that is in an open state, said computer program product comprising a computer readable storage medium having program instructions embodied therewith, said program instructions being executable by one or more computing systems or controllers to cause said one or more computing systems to at least:

detect an open state of said NAND flash memory block, said NAND flash memory block comprising a plurality of memory pages, each of which comprising a plurality of memory cells;

identify a group of pages of said NAND flash memory block being in an open state having comparable characteristics, and perform a calibration of read voltage values to pages of said group of identified pages, wherein said NAND flash memory block in said open state comprises non-programmed memory pages and memory pages that are invalidated memory pages, wherein any invalidated pages of said NAND flash memory block are excluded from said calibration.

19. The computer program product of claim 18, wherein the comparable characteristics include comparable history of the memory cells.

20. The computer program product of claim 18, wherein the characteristics include a read disturb characteristic.

* * * * *